United States Patent [19]

Gent et al.

[11] Patent Number: 4,695,774
[45] Date of Patent: Sep. 22, 1987

[54] LINE OUTPUT CIRCUIT FOR GENERATING A LINE FREQUENCY SAWTOOTH CURRENT

[75] Inventors: Derek J. Gent, Wallington; Michael Bergström, Sutton, both of England

[73] Assignee: U.S. Philips Corporation, New York, N.Y.

[21] Appl. No.: 873,229

[22] Filed: Jun. 11, 1986

[30] Foreign Application Priority Data

Jun. 19, 1985 [GB] United Kingdom ............... 8515483

[51] Int. Cl.$^4$ ..................... H01J 29/70; H01J 29/76
[52] U.S. Cl. .................................................. 315/408
[58] Field of Search ................... 315/408, 370, 371; 358/38, 137

[56] References Cited

U.S. PATENT DOCUMENTS 4,242,714 12/1980 Yoshida et al. .................. 315/408
4,645,989 2/1987 Barnes .............................. 315/408

Primary Examiner—Theodore M. Blum
Attorney, Agent, or Firm—Thomas A. Briody; William J. Streeter; Gregory P. Gadson

[57] ABSTRACT

A line output circuit has a transistor (TR) whose collector is connected through the primary winding (P) of a transformer (T) to a direct voltage supply terminal (2), the secondary winding (S) of the transformer (T) being connected through a diode (D1) to a terminal (3) at which an EHT supply appears. A diode (D2) shunts the collector-emitter path of transistor (TR) to provide a path for negative going sawtooth current. Two serially connected flyback capacitors (Cf1, Cf2) also shunt the transistor (TR), one capacitor (Cf2) being shunted by a switch (S1). The series arrangement of a linearity correction inductor (L1), a deflection coil (Ly), a further inductor (L2) and a trace capacitor (Ct1) also shunt the transistor (TR), the inductor (L2) and trace capacitor (Ct1) also being shunted by the series arrangement of a further trace capacitor (Ct2), a linearity correction resistor (R) and a switch (S2). With the switches (S1, S2) in the conditions as shown the circuit operates at a high line frequency but in the conditions opposite to that shown, the circuit operates at a lower line frequency, with subsequent change to line drive pulses applied to a terminal (1). The values of the circuit components are chosen such that the ratio of the flyback period to the line period of the sawtooth current generated is the same at both line frequencies while the supply voltage to the deflection coil (Ly) is in part present across the inductor (L2) at the lower frequency to ensure the same scan current at both frequencies. This ensures that with the same supply voltage at terminal (2) the EHT supply voltage and the magnitude of the deflection current through the deflection coil (Ly) are the same at both line frequencies.

13 Claims, 2 Drawing Figures

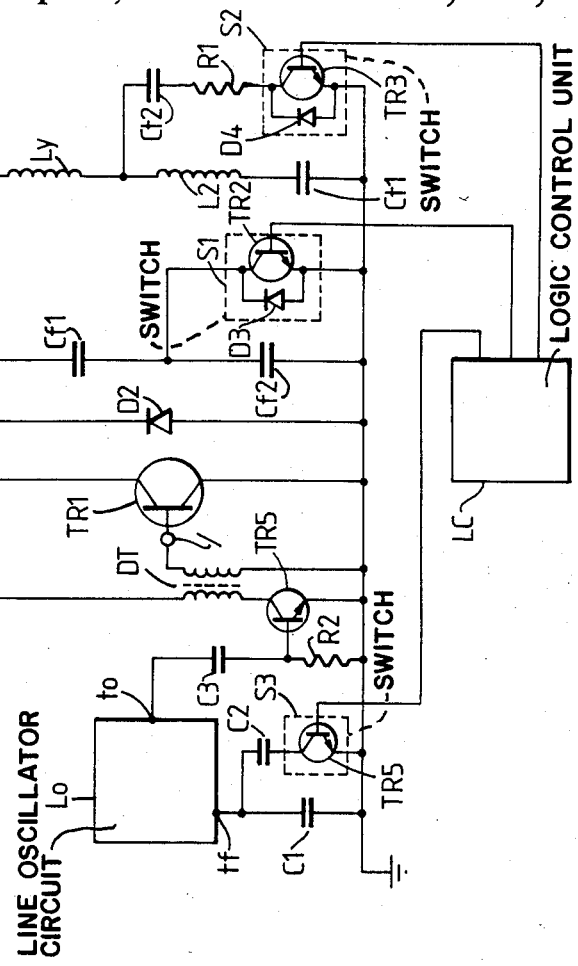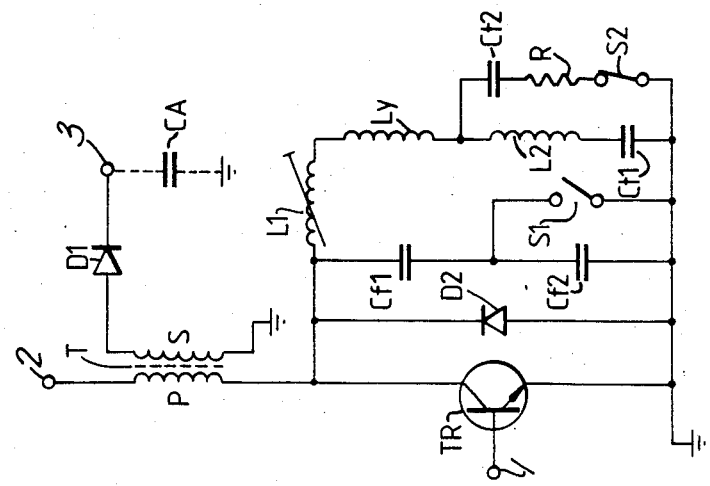

LINE OUTPUT CIRCUIT FOR GENERATING A LINE FREQUENCY SAWTOOTH CURRENT

BACKGROUND OF THE INVENTION

The invention provides a line output circuit for generating a sawtooth deflection current having a scan period and a flyback period selectively at a first or a second line frequency through a line deflection coil for deflecting an electron beam in a cathode ray display tube where said second frequency is higher than said first frequency, said circuit comprising the series arrangement of a line deflection coil and first or second trace capacitance selected by first switch means which series arrangement is connected across the terminals of a controlled switch, flyback capacitance also being connected across the terminals of said controlled switch, one terminal of the controlled switch being additionally connected to the primary winding of a transformer which winding is additionally arranged to receive a voltage supply form a source of direct voltage, said transformer having a secondary winding one end of which is connected to a rectifier for generating, during the flyback period, the EHT supply for the final anode of a display tube, said controlled switch being conducting during the scan period and being rendered non-conducting at the end of the scan period under the control of line pules at said first or second frequency applied to a control input of said controlled switch to initiate the flyback period.

Such a line output circuit is known from U.S. Pat. No. 4,516,169 and is used in television monitors or data graphic displays for deflecting an electron beam or beams in the line direction across the face of a cathode ray display tube at different line frequencies. The ability to operate at different line frequencies at different times is achieved by changing the supply voltage to the circuit and the switching of the trace capacitance. The requirement to change the supply voltage means that the power supply needs to be of a relatively complex design and makes it difficult to prove an off the shelf design which can readily be adapted to different line frequencies not having a specified relationship. In addition, the circuit of the above patent provides a difference in the ratio between the flyback and line periods for the line frequencies which means that it would be necessary to cause the display to overscan at the lower frequency if the video information is to occupy the same display space at both line frequencies.

SUMMARY OF THE INVENTION

It is an object of the invention to provide a line output circuit capable of operating at more than one line frequency where the resulting parameters are substantially the same for each frequency.

The invention provides a line output circuit for generating a sawtooth deflection current having a scan period and a flyback period selectively at a first or second line frequency through a line deflection coil for deflecting an electron beam in a cathode ray display tube where said second frequency is higher than said first frequency, said circiut comprising the series arrangement of a line deflection coil and first or second trace capacitance selected by first switch means which series arrangement is connected across the terminals of a controlled switch, flyback capacitance also being connected across the terminals of said controlled switch, one terminal of the controlled switch being additionally connected to the primary winding of a transformer which winding is additionally arranged to receive a voltage supply from a source of direct voltage, said transfomer having a secondary winding one end of which is connected to a rectifier for generating, during the flyback period, the EHT supply for the final anode of a display tuve, said controlled switch being conducting during the scan period and being rendered non-conducting at the end of the scan period under the control of line pulses at said first or second frequency applied to a control input of said controlled switch to initiate the flyback period, characterised in that said first switch means additionally causes an inductor to be included in the series arrangement of the deflection coil and the appropriate trace capacitance when said circuit is set for operation at the first line frequency for maintaining substantially the same scan current through said deflection coil as when set for said second line frequency with the same value for the direct supply voltage, said circuit further comprising second switch means for selecting flyback capacitance of a higher value when set for operation at said first line frequency than when set for operation at the second line frequency for maintaining substantially the same ratio between the flyback and line periods at both line frequencies,t he value of the EHT supply generated by said circuit being substantially the same when the circuit operates at either the first or the second line frequency.

The first trace capacitance may be connected to the deflection coil through the inductor whilst the series connection of the second trace capacitance, a linearity resistor and the first switch means may be connected in parallel witht he first trace capacitance and the inductor, the first switch means being non-conducting when the circuit operates at the first line frequency and conducting when set to operate at the second line frequency. Where the trace capacitance provices 'S' correction changing the trace capacitance can ensure optimum 'S' correction at both line frequencies.

The flyback capacitance, when operating at the second line frequency, may comprise two capacitors connected in series, the second switch means being connected in parallel with one of the two capacitors which is short circuited by the second switch means whee the circuit is set to operate at the first line frequency.

The first and second switch means may each comprise a bipolar transistor whose emitter-collector path is shunted by a diode poled to form a bi-directional switch.

A line oscillator arrangement may provide line frequency pulses for the application to the control electrode of the controlled switch for controlling its conduction, the frequency of operation of the line oscillator arrangement being determined by a capacitance which is changed by third switch means to change the frequency of the line oscillator arrangement from the first to the second line frequency and vice versa.

The states of the switch means may be effected under the control of a logic controller in response to a signal applied to a display unit in which said line output circuit is incorporated. This response may be to a change in line frequency of a video signal applied to the display unit.

When the circuit operation is to be changed from the second to the first line frequency the state of the second switch means may be changed before the state of the third switch means is changed under the control of the logic controller whilst when operation is to be changed from the first to the second line frequency the state of the third switch means may be changed before that of the second switch means also under the control of the logic controller. The state of the first switch means may be changed either between the changes of state of the second and third switch means or simultaneously with that of the second switch means under the control of the logic controller.

BRIEF DESCRIPTION OF THE DRAWINGS

The above and other features of the invention will now be described, by way of example, with reference to the accompanying drawing, in which:

FIG. 1 is a diagram of a line output circuit according to the invention, and

FIG. 2 is a modification of the diagram of FIG. 1.

DETAILED DESCRIPTION OF THE INVENTION

In FIG. 1 an input terminal 1 receives a pulse train of line frequency pulses which are applied to the base of an non transistor TR whose emitter is connected to earth. The collector of this transistor TR is connected to one end of the primary winding P of a transformer T whose other end is connected to a terminal 2 which is connected in turn to a positive dc supply whose negative terminal is connected to earth. The transformer T has a secondary winding S one terminal of which is connected through a diode D1 whilst the other is earthed, the cathode of diode D1 being connected via a terminal 3 to the final anode of a data graphics display tube (not shown) to produce the EHT supply for this anode whose capacitance CA smooths this supply. The transformer may have other secondary windings which are not relevant to the invention. A further diode D2 poled in the manner shown is connected between the collector and emitter of transistor TR whilst two flyback capacitors Cf1 and Cf2 are serially connected in a similar manner across the transistor TR, a switch S1 being connected in parallel with capacitor Cf2. The collector of transistor TR is also connected through a linearity control inductor L1 to a deflection coil Ly which in turn is connected through a further inductor L2 and a first trace capacitor Ct1 to earth. The junction of deflection coil Ly and inductor L2 is connected to the series arrangement of a second trace capacitor Ct2, a linearity correction resistor R and a second switch S2, to earth.

The operation of the circuit will initially be described with the switches in the conditions as shown in FIG. 1, namely with switch S1 open and switch S2 closed. The circuit is energized from a substantially constant dc supply applied to terminal 2 which may typically lie between 30 and 120 volts. At the start of the scan period the energy stored in the deflection coil Ly immediately after the flyback period causes a current to flow through the linearity control inductor L1, the diode D2, the closed contacts of switch S2, the linearity correction resistor R (whose resistance is low compared with the impedance of inductor L2) and the trace capacitor Ct2 such that a sawtooth shaped deflection current initially of negative polarity flows through the deflection coil Ly. If the transistor TR is of a type which is able to conduct in its reverse direction then the diode D2 may be dispensed with. At some time prior to the centre of the scan period a drive pulse is applied via terminal 1 to the base of traansistor TR to render that transistor conducting such that when the polarity of the sawtooth deflection current reverses it flows through the transistor TR in the forward direction, the time at which transistor TR is rendered conducting also being determined by the need to supply energy to the circuit from the supply at terminal 2. At the end of the scan period transistor TR is cut-off by the removal of the pulse from terminal 1 to initiate the flyback period which period is determined by inductance and capacitance in circuit in known manner, the capacitance principally involved being the serially connected flyback capacitors Cf1 and Cf2. The lower end of the primary winding P which was previously connected to earth through transistor TR is now disconnected therefrom and a half sinewave occupying the flyback period is set-up across the primary winding P to produce a high peak voltage thereacross which is transformed at the secondary winding S to produce the very high voltage for the EHT supply appearing at terminal 3 after rectification by diode D1. The cycle of operation is repeated at the end of the flyback period.

In the above described circuit the frequency of operation is determined by the rate at which line drive pulses are applied to the terminal 1 whilst the peak voltage across the primary winding P and hence the magnitude of the EHT supply at terminal 3 is determined by the ratio of the flyback period to the line period at a constant dc supply at terminal 2. If the frequency of operation were now lowered by a reduction in the frequency of the drive pulses applied to terminal 1 then with the circuit as so far described the line period would be increased whilst the flyback period would stay the same. This would result in a decrease of the above ratio which in turn would produce an increase in the peak volts at the collector of transistor TR as well as the EHT supply at terminal 3. At the same time with the same supply voltage present at terminal 2 and the consequent increase in scan period the scan current through the deflection coil Ly would be increased at the lower frequency. The increase in the collector peak volts and/or increase in scan current could destroy the transistor TR and even if this transistor were not damaged then the scan current and EHT would be incorrect.

The above disadvantages can be overcome if, when operating at the lower frequency, the switches S1 and S2 are moved to their positions opposite to that shown, namely S1 closed and S2 open. With switch S1 closed the second flyback capacitor Cf2 is removed from circuit such that only the first flyback capacitor Cf1 remains and which has a higher capacitance than capacitors Cf1 and Cf2 in series to increase the flyback period. The capacitance values of capacitors Cf1 and Cf2 are chose such that capacitor Cf1 alone gives the same ratio between the flyback and line periods at the lower frequency as the series combination of capacitors Cf1 and Cf2 gives at the higher frequency. By maintaining the ratio between flyback and line periods the same at both the lower and higher frequencies the EHT supply at terminal 3 is maintained at the same value. With switch S2 opened the inductor L2 and capacitor Ct1, both previously short circuited, are introduced in series with the deflection coil Ly and part of the supply voltage for the deflection coil Ly appears across inductor L2 to reduce the actual drive voltage across the deflection coil. The inductance value of inductor L2 is chosen such that the current through the deflection coil Ly is the same at the low frequency as at the high frequency. The trace capacitor is also changed when switch S2 is opened as this capacitor also provides 'S' correction the degree of which needs to be changed with change in line frequency. The required change in linearity is obtained by the omission of the resistor R from circuit and the presence of the resistance of inductor L2.

FIG. 2 is a more detailed circuit diagram of the line output circuit of FIG. 1, with switches S1 and S2 being shown in one form they may take, and including other features. In FIG. 2 the same reference symbols are used for the same components as in FIG. 1 save that transistor TR and linearity correction resistor R are respectively indicated by the reference symbols TR1 and R1. Switch S1 is formed by an npn transistor TR2 whose emitter-collector path is connected across flyback capacitor cf2, this path also being shunted by a diode D3 to make switch S1 bi-directional. The base of transistor TR2 is connected to a logic control unit LC which supplies a base current when switch S1 is to conduct. Switch S2 is similarly formed by a transistor TR3 and a diode D4, the base of transistor TR3 also being connected to the logic control unit LC to control its conduction. A line oscillator circuit LO, which may take the form of an integrated circuit, has its frequency determining terminal tf connected through a capacitor C1 to earth, this terminal also being connected to earth through a further capacitor C2 and the collector-emitter path of a transistor TR4 which forms a third switch S3. The base of transistor TR4 is also connected to the logic control unit LC to control its conduction, transistor TR4 being non-conductive when the line oscillator is to oscillate at the higher line frequency but being conductive to increase the capacitance at terminal tf when the line oscillator is to oscillate at the lower line frequency. The line frequency pulse output from the line oscillator LO is derived from an output terminal to and applied via a capacitor C3 to the base of a driver transistor TR5 which base is connected to earth through a resistor R2. The emitter of transistor TR5 is connected to earth whilst its collector is connected through the primary winding of a driver transformer T to a supply terminal 4. The resulting line frequency drive pulses appearing at the secondary winding of driver transformer DT are applied to the terminal 1.

The logic control unit LC controlling the switching of the three switches S1, S2 and S3 is arranged to respond to a signal from the apparatus supplying information to be displayed by a display unit incorporating the circuit described. This signal may be a dedicated signal or may be derived by sensing changes in frequency of the information to be displayed. If the three switches S1, S2 and S3 changed their states instantaneously then they could be operated simultaneously. As in practice such simultaneous switching may not be achieved there is the possibility that the peak voltage at the collector of transistor TR1 could rise above an acceptable level for a short period. In order to avoid this when the circuit is being changed from high to low line frequency then switch S1 must be closed before switch S3 is closed whilst when changing from low to high frequency switch S3 must be opened before switch S1 is opened. For both these conditions switch S2 can have its condition changed either on the change of state of switch S1 or between the changes of state of switches S1 and S3.

It will of course be realised that the components to be switched in FIGS. 1 and 2 may be positioned differently to those shown provided the desired results are achieved. For instance the flyback capacitors Cf1 and Cf2 may be provided in parallel to give the longer flyback period required at the lower line frequency whilst one of these capacitors may be disconnected by switch S1 for the higher line frequency; the capacitors C1 and C2 may be connected in series with switch S3 connected in parallel with one of these capacitors; switch S2 may also be placed differently to that shown. In addition whilst the circuit described only shows switching between two line frequencies it would be possible to provide switching between more than two frequencies whilst retaining the same supply voltage.

We claim:

1. A line output circuit for generating a sawtooth deflection current having a scan period and a flyback period selectively at a first or a second line frequency through a line deflection coil for deflecting an electron beam in a cathode ray display tube where said second frequency is higher than said first frequency, said circuit comprising the series arrangement of a line deflection coil and first or second trace capacitance selected by first switch means which series arrangement is connected across the terminals of a controlled switch, flyback capacitance also being connected across th terminals of said controlled switch, one terminal of the controlled switch being additionally connected to the primary winding of a transformer which winding is additionally arranged to receive a voltage supply from a source of direct voltage, said transformer having a secondary winding one end of which is connected to a rectifier for generating, during the flyback period, the EHT supply for the final anode of a display tube, said controlled switch being conducting during the scan period and being rendered non-conducting at the end of the scan period under the control of line pulses at said first or second frequency applied to a control input of said controlled switch to initiate the flyback period, characterised in that said first switch means additionally causes an inductor to be included in the series arrangement of the deflection coil and the appropriate trace capacitance when said circuit is set for operation at the first line frequency for maintaining substantially the same scan current through said deflection coil as when set for said second line frequency with the same value for the direct supply voltage, said circuit further comprising second switch means for selecting flyback capacitance of a higher value when set for operation at said first line frequency than when set for operation at the second line frequency for maintaining substantiallyt he same ratio between the flyback and line periods at both line frequencies, the value of the EHT supply generated by said circuit being substantially the same when the circuit operates at either the first or the second line frequency.

2. A line output circuit as claimed in claim 1, characterised in that the first trace capacitance is connected to said deflection coil through said inductor whilst the series connection of the second trace capacitance, a linearity resistor and the first switch means is connected in parallel with the first trace capacitance and the inductor, said first switch means being non-conducting when said circuit operates at the first line frequency and conducting when set to operate at the second line frequency.

3. A line output circuit as claimed in claim 1, in which said flyback capacitance, when operating at the second line frequency, comprises two capacitors connected in series, characterised in that said second switch means is connected in parallel with one of the two capacitors which is short circuited by the second switch means where the circuit is set to operate at the first line frequency.

4. A line output circuit as claimed in claim 1, characterised in that the first and second switch means each comprises a bipolar transistor whose emitter-collector path is shunted by a diode poled to form a bi-directional switch.

5. A line output circuit as claimed in claim 4, in which a line oscillator arrangement provides line frequency pulses for the application to the control electrode of the controlled switch for controlling its conduction, the frequency of operation of the line oscillator arrrangement being determined by capacitance, characterised in that this capacitance is changed by third switch means to change the frequency of the line oscillator arrangement from the first to the second line frequency and vice versa.

6. A line output circuit as claimed in claim 5, characterised in that the states of said switch means is effected under the control of a logic controller in response to a signal applied to a display unit in which said line output circuit is incorporated.

7. A line output circuit as claimed in claim 6, characterised in that said logic controller responds to a change in line frequency of a video signal applied to said display unit.

8. A line output circuit as claimed in claim 6 when characterised in that when said circuit operation is to be changed from the second to the first line frequency the state of the second switch means is changed before the state of the third switch means is charged under the control of the logic controller whilst when operation is to be changed from the first to the second line frequency the state of the third switch means is changed before that of the second switch means also under the control of the logic controller.

9. A line output circuit as claimed in claim 8, characterised in that the state of the first switch means is changed either between the changes of state of the second and third switch means or simultaneously with that of the second switch means under the control of the logic controller.

10. A line output circuit as claimed in claim 2, in which said flyback capacitance, when operating at the second line frequency, comprises two capacitors connected in series, characterised in that said second switch means is connected in parallel with one of the two capacitors which is short circuited by the second switch means where the circuit is set to operate at the first line frequency.

11. A line output circuit as claimed in claim 2, characterised in that the first and second switch means each comprises a bipolar transistor whose emitter-collector path is shunted by a diode poled to form a bi-directional switch.

12. A line output circuit as claimed in claim 3, characterised in that the first and second switch means each comprises a bipolar transistor whose emitter-collector path is shunted by a diode poled to form a bi-directional switch.

13. A line output circuit as claimed in claim 7, characterised in that when said circuit operation is to be changed from the second to the first line frequency the state of the second switch means is changed before the state of the third switch means is charged under the control of the logic controller whilst when operation is to be changed from the first to the second line frequency the state of the third switch means is changed before that of the second switch means also under the control of the logic controller.

* * * * *